(12) United States Patent
Fujikura et al.

(10) Patent No.: US 11,951,755 B2
(45) Date of Patent: Apr. 9, 2024

(54) PRINTING APPARATUS AND PRINTING METHOD

(71) Applicant: Oki Electric Industry Co., Ltd., Tokyo (JP)

(72) Inventors: Shuichi Fujikura, Tokyo (JP); Bing Han, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 302 days.

(21) Appl. No.: 17/411,881

(22) Filed: Aug. 25, 2021

(65) Prior Publication Data

US 2022/0118781 A1 Apr. 21, 2022

(30) Foreign Application Priority Data

Oct. 21, 2020 (JP) .................................. 2020-176406
Jun. 29, 2021 (JP) .................................. 2021-107764

(51) Int. Cl.
- *B41J 29/377* (2006.01)
- *B41J 11/02* (2006.01)
- *G03G 15/20* (2006.01)
- *G03G 21/20* (2006.01)
- *H05K 7/20* (2006.01)

(52) U.S. Cl.
CPC ............. *B41J 29/377* (2013.01); *B41J 11/02* (2013.01); *G03G 15/2039* (2013.01); *G03G 21/203* (2013.01); *H05K 7/20136* (2013.01); *H05K 7/202* (2013.01)

(58) Field of Classification Search
CPC ..... B41J 11/02; B41J 29/377; G03G 15/2039; G03G 21/203; G03G 21/20; H05K 7/20136; H05K 7/202
See application file for complete search history.

(56) References Cited

U.S. PATENT DOCUMENTS 7,030,898 B2 * 4/2006 Tsubota ................... B41J 2/375
 347/18
9,104,154 B2 * 8/2015 Fujiwara ............ G03G 15/2039

FOREIGN PATENT DOCUMENTS

JP 2020-34873 A 3/2020

* cited by examiner

*Primary Examiner* — Geoffrey S Mruk
(74) *Attorney, Agent, or Firm* — METROLEX IP LAW GROUP, PLLC

(57) ABSTRACT

A printing apparatus according to an embodiment may include: a printing device; a cooling device; an environmental value detector configured to detect an environmental value in or around the printing apparatus; an environmental value storage storing the environmental value detected by the environmental value detector before a current printing operation starts; and a print controller configured, in response to starting the current printing operation, to select one of the environmental value stored in the environmental value storage before the start of the current printing operation and an environmental value detected by the environmental value detector after a start of cooling the printing device by the cooling device in the current printing operation, calculate, based on the selected environmental value, a parameter for the printing device to perform the current printing operation, and cause the printing device to perform the current printing operation based on the calculated parameter.

15 Claims, 10 Drawing Sheets

FIG. 8

|  | STOP FIXATION FAN | ROTATE FIXATION FAN |
|---|---|---|
| IMMEDIATELY AFTER TURNING ON POWER | 24°C/23% | 24°C/23% |
| IMMEDIATELY AFTER PRINTING 250 SHEETS | 33°C/22% | 33°C/14% |
| 1 MINUTE AFTER WAITING | 27°C/20% | 31°C/14% |
| 2 MINUTES AFTER WAITING | 26°C/21% | 30°C/14% |
| 3 MINUTES AFTER WAITING | 26°C/22% | 30°C/14% |

PRINTING APPARATUS AND PRINTING METHOD

CROSS REFERENCE TO RELATED APPLICATIONS

This application claims priority based on 35 USC 119 from prior Japanese Patent Applications No. 2020-176406 filed on Oct. 21, 2020, entitled "PRINTING APPARATUS AND PRINTING METHOD" and No. 2021-107764 filed on Jun. 29, 2021, entitled "PRINTING APPARATUS AND PRINTING METHOD", the entire contents of which are incorporated herein by reference.

BACKGROUND

The disclosure may relate to a printing apparatus and a printing method.

In a related art, electrophotographic image formation apparatuses have been used as printing apparatuses. A development process and a transfer process in an electrophotographic process are greatly affected by humidity because powders are used. In addition, electrical resistances of rollers through which a development bias voltage is applied and electrical resistances of rollers through which a transfer bias voltage is applied are changed with temperature. Accordingly, the temperature and humidity of the rollers may be needed to make corrections to the changes. Furthermore, if the temperature of a medium is low, a fixing performance may be deteriorated. Accordingly, the temperature of the medium may also be needed to correct the fixing temperature.

Since these temperatures and humidity correspond to an installation environment of the equipment in a typical office environment, the environmental temperature and humidity are measured by an environmental sensor.

Generally, in an electrophotographic image formation apparatus, the more images are formed per hour, the more heat is generated in the fixation unit and the development unit, and the more heat is transmitted to the environmental sensor, so the environmental temperature and humidity detected by the environmental sensor may be shifted to the higher side.

Therefore, for example, in an image formation apparatus described in Patent Document 1, a fan is provided to the fixation device to discharge the heat generated in the fixation device so as to cool the interior of the image formation apparatus.

Patent Document 1: Japanese Patent Application Publication No. 2020-34873

SUMMARY

While the fan is operating in the image formation apparatus, the heat inside the image formation apparatus can be discharged. However, after the image formation process is finished and the fan is stopped, the heat inside the image formation apparatus may not be discharged and thus may be trapped inside the image formation apparatus.

When the image formation process is resumed with the heat trapped inside the image formation apparatus, an error in the value read by the environmental sensor provided in the image formation apparatus increases due to the heat transmitted to the environmental sensor.

The temperature in the image formation apparatus with the heat trapped therein does not drop immediately after the fan is turned on, and it may take a hundred or more seconds that the temperature in the image formation apparatus drops. Therefore, it may not be appropriate to use the value detected by the environmental sensor immediately after the fan is turned on in the image formation apparatus with the trapped heat, to control devices in the image formation apparatus.

Therefore, an object of one or more aspects of the disclosure is to enable to use an appropriate value acquired by an environmental sensor even when heat is trapped inside a printing apparatus.

A printing apparatus according to an aspect of the disclosure may include: a printing device configured to print on a medium; a cooling device configured to cool the printing device; an environmental value detector configured to detect an environmental value, which is a value corresponding to a physical quantity of an environment in or around the printing apparatus; an environmental value storage storing the environmental value detected by the environmental value detector before a start of a current printing operation; and a print controller configured, in response to starting the current printing operation, to select one of the environmental value detected by the environmental value detector after a start of cooling of the printing device by the cooling device in the current printing operation and the environmental value stored in the environmental value storage before the start of the current printing operation, calculate, based on the selected environmental value, a parameter for the printing device to perform the current printing operation, and cause the printing device to perform the current printing operation based on the calculated parameter.

A printing method according to an aspect of the disclosure may be a printing method performed by a printing apparatus equipped with a printing device configured to perform printing on a medium. The method may include: storing an environmental value that was detected before a start of a current printing operation, wherein the environmental value is a value corresponding to a physical quantity of an environment in or around the printing apparatus; selecting, in response to starting the current printing operation, one of the environmental value stored before the start of the current printing operation and an environmental value detected after a start of cooling of the printing device in the current printing operation; calculating, based on the selected environmental value, a parameter for the printing device to perform the current printing operation; and causing the printing device to perform, based on the calculated parameter, the current printing operation.

According to one or more aspects described above, even when heat is trapped in the printing apparatus, an appropriate value acquired by the environmental value detector can be used.

BRIEF DESCRIPTION OF DRAWINGS

FIG. 8 is a table illustrating changes in the temperature detected in the printer according to a second embodiment;

DETAILED DESCRIPTION

Figure 1:
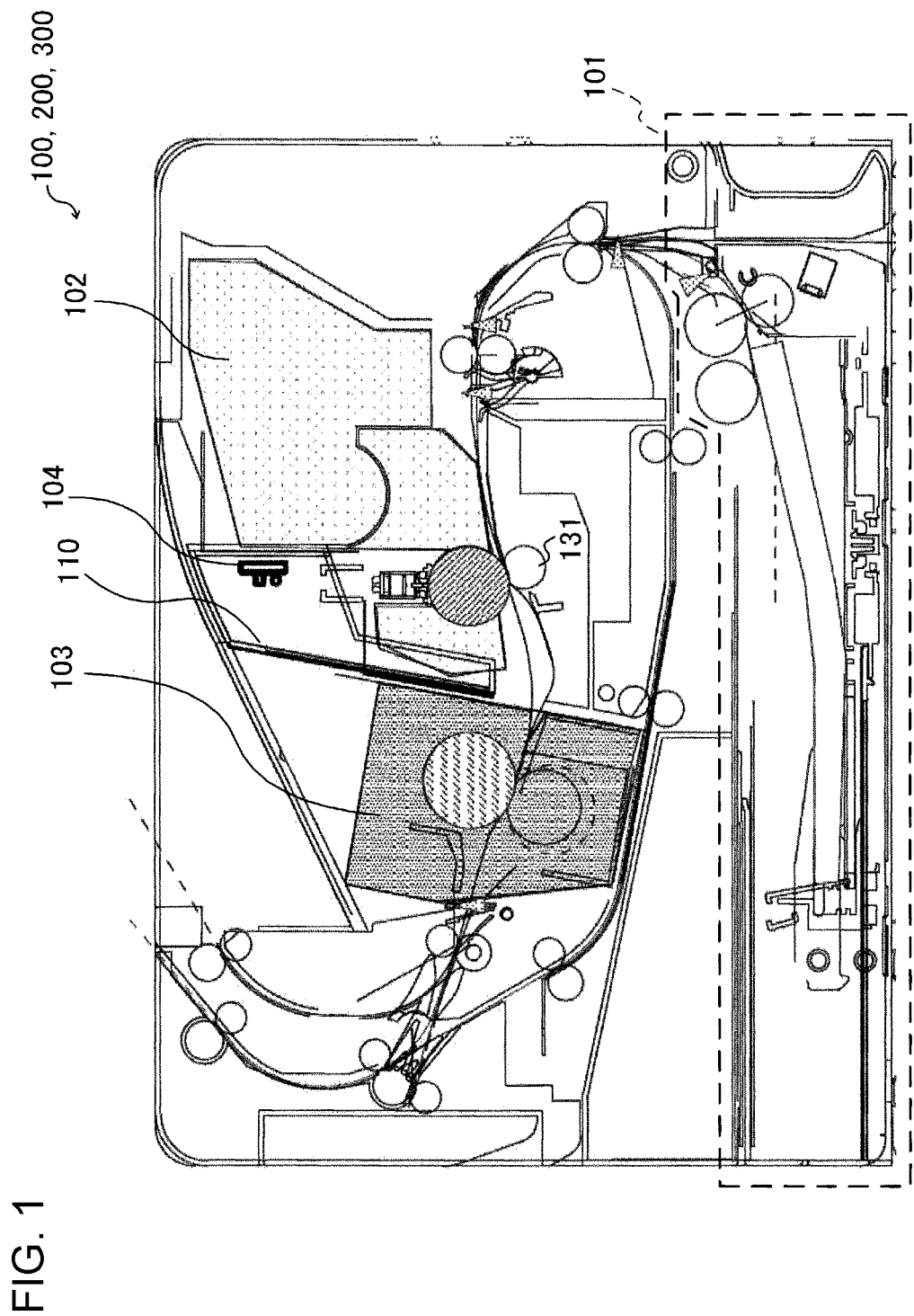
FIG. 1 is a diagram of a cross sectional view illustrating a main configuration of a printer as a printing apparatus according to first to third embodiments.

Descriptions are provided hereinbelow for embodiments based on the drawings. In the respective drawings referenced herein, the same constituents are designated by the same reference numerals and duplicate explanation concerning the same constituents is omitted. All of the drawings are provided to illustrate the respective examples only.

First Embodiment

FIG. 1 is a schematic diagram illustrating a cross-sectional view of a configuration of a part of a printer 100 as a printing apparatus according to a first embodiment. Herein, the case is described in which the printer 100 is used as an electrophotographic image formation apparatus. The printer 100 is provided with a paper feeding unit 101, an image formation unit 102 as a printing unit, and a fixation unit 103.

The paper feeding unit 101 is a medium supply unit that supplies paper as a medium on which an image is to be formed in the printer 100. The image formation unit 102 forms a toner image as a developer image on a sheet of paper supplied by the paper feeding unit 101 using an electrophotographic process. The fixation unit 103 fixes the toner image that has been transferred to the sheet of paper to the sheet of paper.

In a first embodiment, an environmental sensor 104 that is configured to detect an environmental value corresponding to a physical quantity required for processing in the printer 100 is provided in the environment in which the printer 100 is installed. In a first embodiment, the environmental sensor 104 includes a temperature sensor configured to measure an environmental temperature, which is an ambient temperature therearound, and a humidity sensor configured to measure an environmental humidity, which is an ambient humidity therearound.

Between the image formation unit 102 and the fixation unit 103, a duct 110 is provided as a ventilator having a wall surface (wall portion) that defines an air passage.

Figure 2:
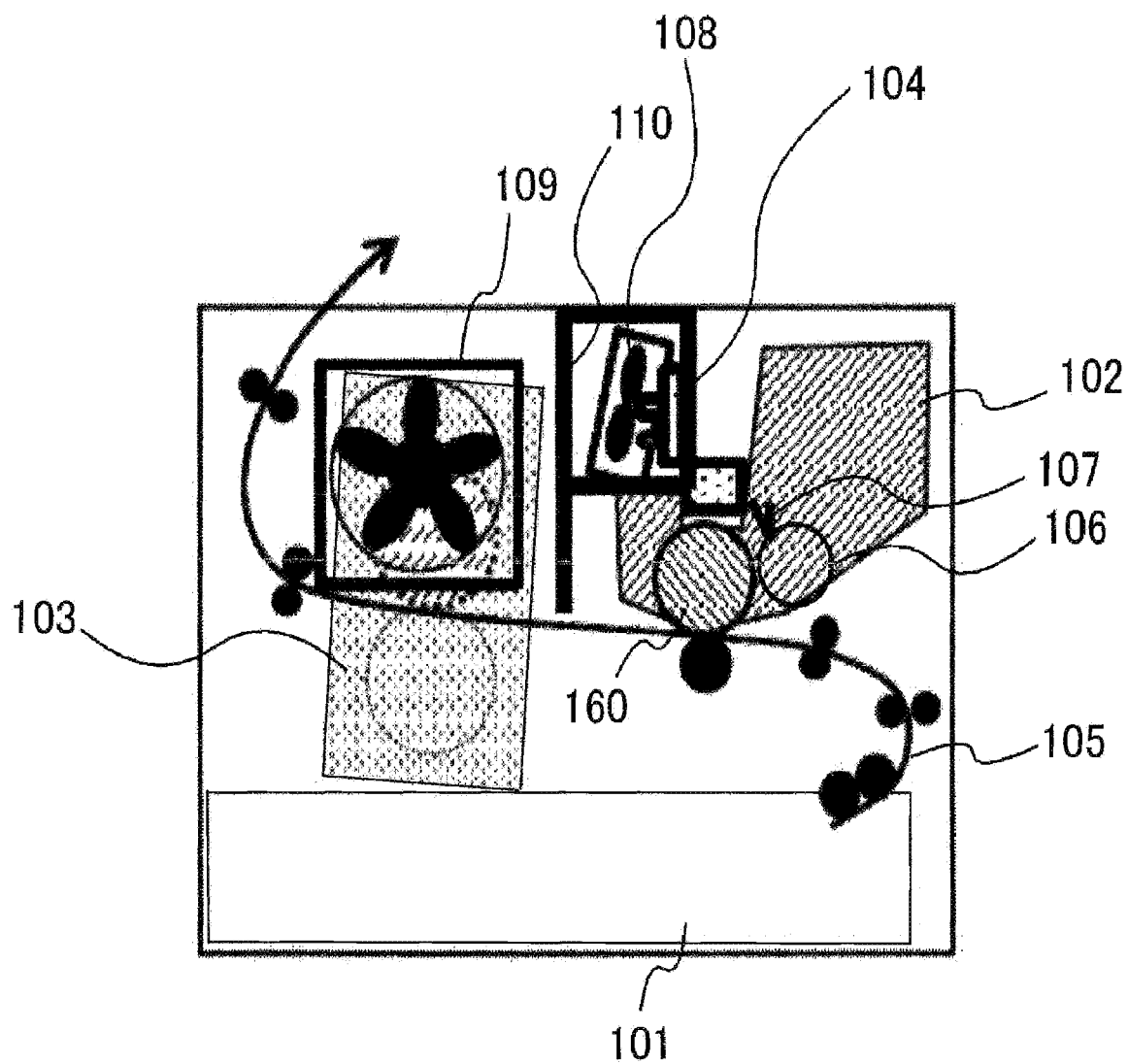
FIG. 2 is a diagram of a side view of the printer, illustrating mounting positions of fans in the printer.
Figure 3:
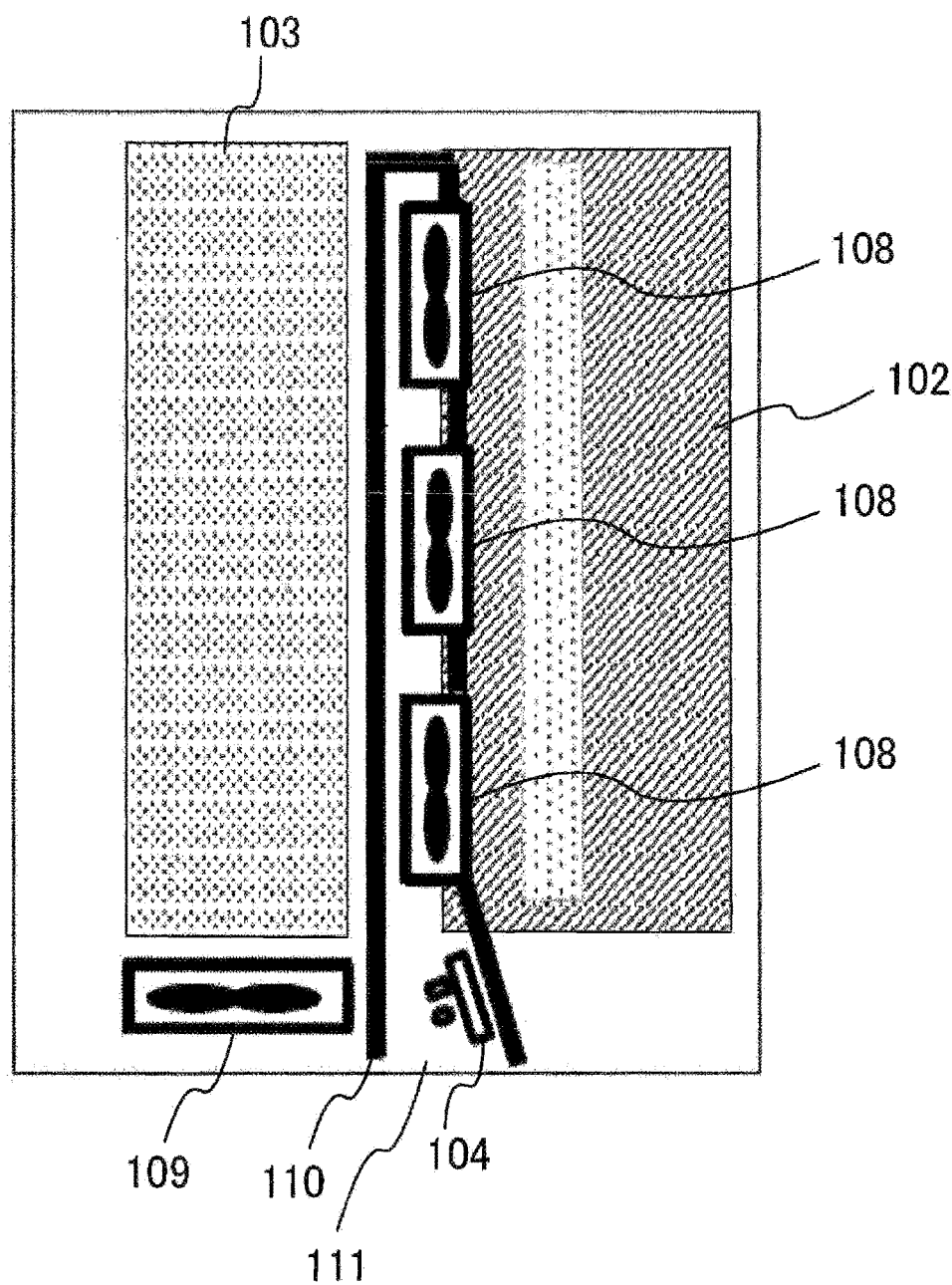
FIG. 3 is a diagram of a top view of the printer, illustrating the mounting positions of the fans.

FIGS. 2 and 3 are schematic diagrams illustrating positions where fans are installed. FIG. 2 is a side view illustrating fan installation positions, and FIG. 3 is a top view illustrating the fan installation positions.

As illustrated in FIG. 2, the printer 100 is provided with the paper feeding unit 101, the image formation unit 102, and the fixation unit 103. A sheet of paper supplied from the paper feed unit 101 is conveyed through a paper conveyance path 105 as a medium conveyance path inside the printer 100 and discharged out of the printer 100.

The toner serving as the developer used in the development process in the image formation unit 102 is charged by friction between a development roller 106 and a development blade 107 in the image formation unit 102. The method of charging the toner in this way is called a frictional charging method. In the frictional charging method, the area subject to friction becomes extremely heated. To cool the heated area, imaging drum (ID) cooling fans 108 are provided at positions adjacent to the image formation unit 102.

The fixation unit 103 includes therein a heating roller which is heated to 160° C. to 170° C., and a pressure roller which presses the medium against the heating roller. The fixation unit 103 fuses the toner to fix the toner to the medium by means of the heat of the heating roller and the pressure of the pressure roller. A fixation fan 109 is provided at a position adjacent to the fixation unit 103 to discharge such heat and water vapor emitted from the medium during the fixing operation of the fixation unit 103 to the outside of the printer 100. The fixation fan 109 is also referred to as an exhaust fan because it rotates to discharge the air from the printer 100.

As illustrated in FIG. 3, in a first embodiment, the ventilation duct 110 and the triple ID cooling fans 108 are provided at positions adjacent to the image formation unit 102. The triple ID cooling fans 108 send air through the duct 110 to the interior of the image formation unit 102. The air to be blown to the image formation unit 102 is taken in from an air intake port 111 of the duct 110. An environmental sensor 104 is provided at a position adjacent to the air intake port 111 in the passage of the air taken in from the air intake port 111. Note that because the air is taken into the printer 100 by the ID cooling fans 108, each of the ID cooling fans 108 may be referred to as an intake fan.

The fixation fan 109 sends the air in the direction toward the fixation unit 103 illustrated in FIG. 3. Hereinafter, any one of the ID cooling fans 108 and the fixation fan 109 may be referred to as an apparatus fan.

Figure 4:
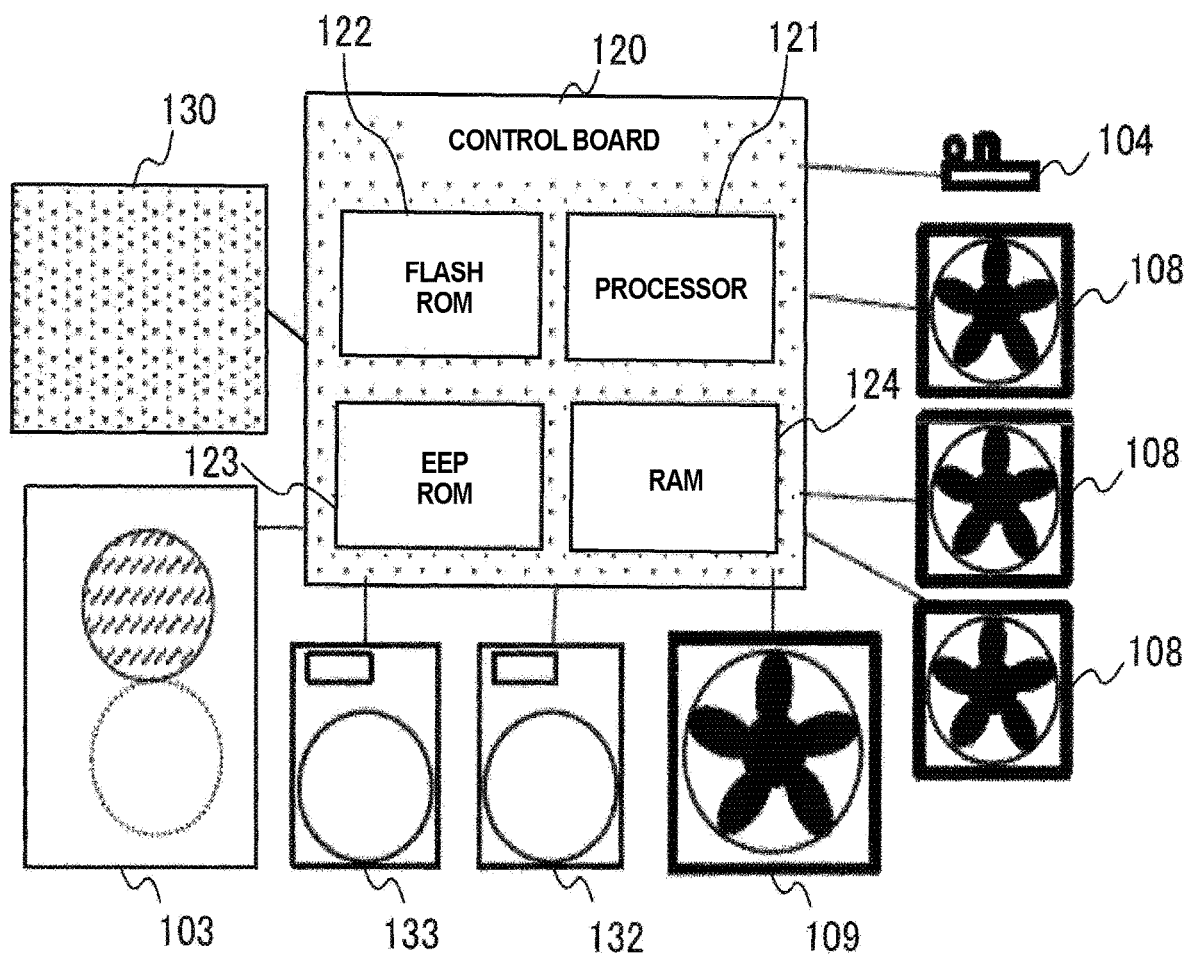
FIG. 4 is a block diagram of a schematic view illustrating a circuit of a control system in the printer.

FIG. 4 is a block diagram schematically illustrating a circuit of a control system provided in the printer 100 according to a first embodiment. A control board 120 that performs control in the printer 100 includes a processor 121 such as a CPU (Central Processing Unit), a FLASH ROM (Read-Only Memory) 122, an EEPROM (Electrically Erasable Programmable Read-Only Memory) 123, and a RAM (Random Access Memory) 124. The control board 120 includes a driver IC (Integrated Circuit), ICs for interfaces, and the like, which are not illustrated in the figure.

The control board 120 supplies power and outputs a PWM (pulse width modulation) signal as an alternating signal to the environmental sensor 104. The control board 120 receives from the environmental sensor 104 a voltage value indicating an environmental temperature, which is a temperature detected by the environmental sensor 104, and a voltage value indicating an environmental humidity, which is a humidity detected by the environmental sensor 104.

The processor 121 of the control board 120 then calculates the environmental temperature and the environmental humidity based on the received voltage values, and determines, based on the calculated environment temperature and humidity, a development bias, a transfer bias, and a fixation temperature.

For example, when the environmental humidity (the calculated environmental humidity) is lower than a predetermined threshold humidity, the processor 121 corrects the development bias to be lower than a predetermined reference development bias, and corrects the transfer bias to be higher than a predetermined reference transfer bias.

When the environmental temperature (the calculated environmental temperature) is lower than a predetermined threshold temperature, the processor 121 corrects the fixation temperature to be higher than a predetermined reference fixation temperature. Here, the case where the reference fixation temperature is 160° C. is explained as an example.

When the environmental temperature is 10° C. or lower, the processor 121 sets the fixation temperature to, for example, 165° C. When the environmental temperature is 5° C. or lower, the processor 121 sets the fixation temperature to, for example, 170° C.

The processor 121 gives a command to output the determined development bias and transfer bias to a high voltage circuit board 130, and the high voltage circuit board 130 outputs the development bias to the image formation unit 102 and the transfer bias to the transfer roller 131 (see FIG. 1) serving as a transfer unit or a transfer device in accordance with the command.

The control board 120 also controls an imaging drum (ID) motor 132 that drives various rollers included in the image formation unit 102, a fixation motor 133 that drives the heating roller and the pressure roller included in the fixation unit 103, the ID cooling fans 108, and the fixation fan 109. Further, the control board 120 is connected to actuators (not illustrated), and performs a series of printing controls (image formation controls) such as paper feeding, developing, transferring and fixing.

Figure 5:
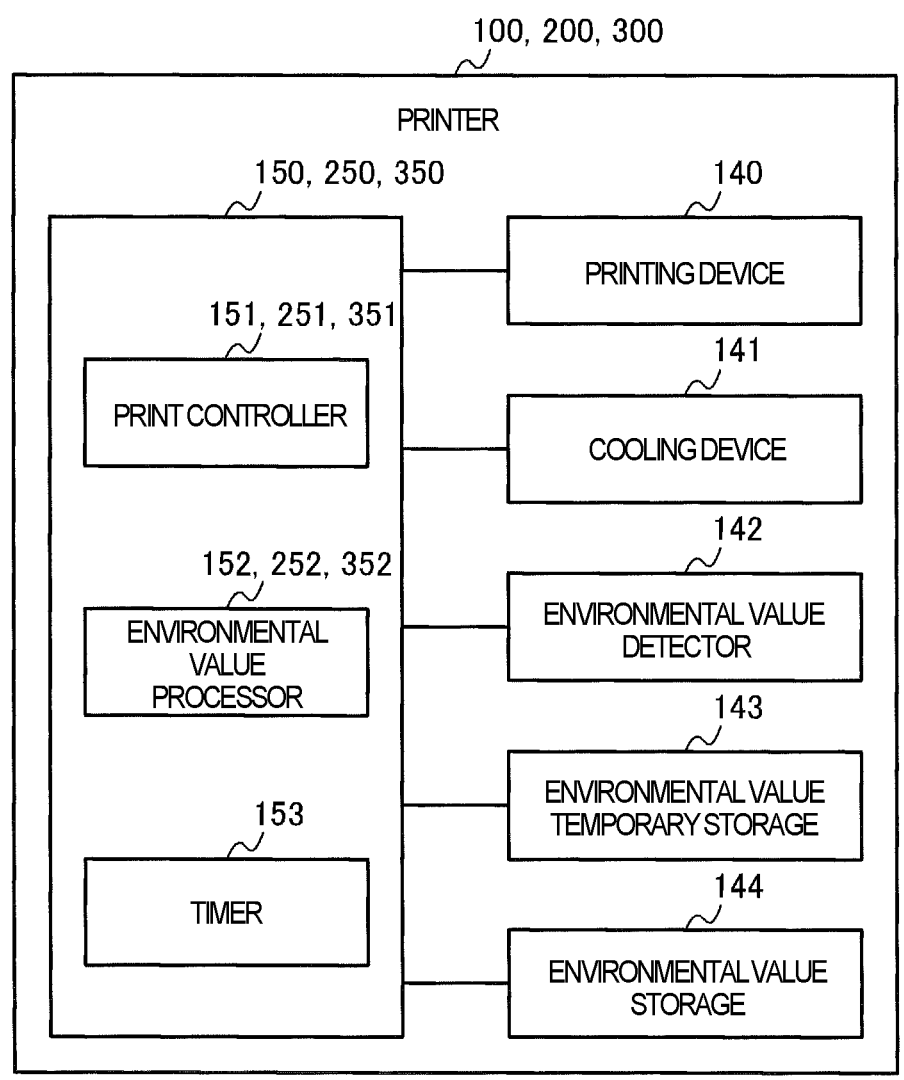
FIG. 5 is a block diagram of schematic view illustrating functions performed by the printer according to first to third embodiments.

FIG. 5 is a block diagram schematically illustrating functions performed by the printer 100 according to a first embodiment. The printer 100 includes a printing device 140 as an image formation device, a cooling device 141, an environmental value detector 142, an environmental value temporary storage 143, an environmental value storage 144, and a controller 150.

The printing device 140 prints on a medium. For example, the printing device 140 conveys paper as a medium, forms an image on the paper, and outputs the paper having the image thereon. The printing device 140 is a printer main body or a printer main unit (an image formation apparatus main unit) including the paper feeding unit 101, the image formation unit 102, the fixation unit 103, and the transfer roller 131 illustrated in FIG. 1.

The cooling device 141 cools the printing device 140. The cooling device 141 is provided with at least any one of the ID cooling fans 108 and the fixation fan 109 illustrated in FIG. 2 or FIG. 3. In an embodiment, the cooling device 141 uses the fans to perform cooling. However, the disclosure is not limited thereto. For example, the cooling device 141 may perform cooling using a liquid such as water, or may perform cooling using a Beltier element or the like.

The environmental value detector 142 detects an environmental value, which is a value corresponding to a physical quantity of the environment therearound. The environmental value detector 142 is realized by the environmental sensor 104. Here, the environmental value detector 142 detects the environmental value corresponding to the physical quantity of the environment around the printing device 140.

The environmental value temporary storage 143 temporarily stores the environmental value detected by the environmental value detector 142. Here, the environmental value temporary storage 143 stores the environmental value in response to instructions from the controller 150. The environmental value temporary storage 143 is realized by the RAM 124.

The environmental value storage 144 stores the environmental value measured by the environmental value detector 142. Here, the environmental value storage 144 stores the environmental value in response to instructions from the controller 150. The environmental value that is stored in the environmental value storage 144 is the environmental value detected by the environmental value detector 142 before the current printing is started. In other words, the environmental value after the printing device 140 has been cooled is stored in the environmental value storage 144. The environmental value storage 144 is realized by the EEPROM 123.

The controller 150 controls the overall processing in the printer 100. The controller 150 includes a print controller 151 as an image formation controller, an environmental value processor 152, and a timing unit 153.

The controller 150 is realized by the processor 121 executing a program stored in the FRASH ROM 122 serving as a memory. Such a program may be provided through a network or provided by being recorded in a recording medium. That is, such a program may be provided, for example, as a program product.

A part or all of the controller 150 may be composed of, for example, a single circuit, a composite circuit, a processor operated by a program, a parallel processor operated by a program, a processing circuit such as an ASIC (Application Specific Integrated Circuit) or an FPGA (Field Programmable Gate Array (FPGA), or the like. As described above, the controller 150 may be realized by a processing circuit network.

The print controller 151 controls the printing device 140 to form an image on a medium. For example, when the printing device 140 starts a current printing operation, the print controller 151 selects one of the environmental value detected by the environmental value detector 142 after the cooling device 141 starts cooling and the environmental value stored in the environmental value storage 144. Then, the print controller 151 calculates, based on the selected environmental value, a parameter to be used in the current printing operation in the printing device 140, and causes the printing device 140 to perform the current printing operation based on the calculated parameter. This allows the print controller 151 to calculate the parameter based on the environmental value detected after the cooling of the printing device 140 is completed.

Specifically, in response to determining that a predetermined first threshold time has elapsed since the environmental value was saved in the environmental value storage 144, the print controller 151 selects the environmental value detected by the environmental value detector 142 after the cooling device 141 starts cooling. In response to determining that the first threshold time has not elapsed since the environmental value was saved in the environmental value storage 144, the print controller 151 selects the environmental value saved in the environmental value storage 144.

The environmental value may be a voltage value corresponding to the environmental temperature, which is the ambient temperature around the printing device 140. The environmental value may comprise a voltage value corresponding to the environmental temperature, which is the ambient temperature around the printing device 140, and a voltage value corresponding to the environmental humidity, which is the ambient humidity around the printing device 140.

The parameter can be at least any one of the fixation temperature, the development bias, and the transfer bias in a case where the printer 100 is an electrophotographic image formation apparatus. On the other hand, the parameter can be at least any one of an ink discharge voltage and an ink drying time in a case where the printer 100 is an inkjet printer (recording device).

The environmental value processor 152 processes the environmental value detected by the environmental value detector 142. For example, the environmental value processor 152 temporarily stores the environmental value detected by the environmental value detector 142 in the environmental value temporary storage 143. Further, when a predetermined condition(s) is satisfied, the environmental value processor 152 store an environmental value in the environmental value storage 144 among the environmental values temporarily stored in the environmental value temporary storage 143.

Specifically, when it is determined that an operating time of the cooling device 141, which is a time in which the cooling device 141 has operated after the printing device 140 started the current printing operation, has passed (exceeded) a predetermined second threshold time, the environmental value processor 152 causes the environmental value that is detected by the environmental value detector 142 after the operating time of the cooling device has passed the second threshold time to be stored in the environmental value storage 144 as a new environmental value. In this case, the print controller 151 determines whether or not the first threshold time has elapsed since the time when the new environmental value was stored. Note that when a predetermined third threshold time has elapsed but the predetermined first threshold time has not elapsed since the environmental value was stored in the environmental value storage 144, the print controller 151 operates the cooling device 141 until the second threshold time elapses, even if the current printing operation finishes before the operating time of the cooling device 141 passes the second threshold time. This allows the environmental value stored in the environmental value storage 144 to be updated with the environmental value detected after the printing device 140 has been sufficiently cooled. Note that the third threshold time is a time shorter than the first threshold time.

The timing unit 153 measures the time. For example, the timing unit 153 measures the length of the time since the environmental value was stored in the environmental value storage 144 and measures the length of the time in which the device fan has been operated.

Next, an operation of the printer 100 according to a first embodiment is described. The printer 100 starts printing operation (image formation operation) when the print controller 151 receives an instruction from a host computer or an external device (not illustrated) via an interface (not illustrated).

When the printing operation is started, the print controller 151 determines the development bias, the transfer bias, and the fixation temperature based on the output of the environmental sensor 104. The print controller 151 starts warming the fixation unit 103 at a same time as the determination of the development bias and the transfer bias. At a same time as the temperature of the fixation unit 103 reaches the fixation temperature, the print controller 151 starts to rotate a paper feed motor (not illustrated), to cause the paper feeding unit 101 to start feeding a sheet of paper.

The print controller 151 starts to operate the image formation unit 102 at a same time as the paper feeding starts, and starts the exposure when the sheet of paper reaches a paper feed sensor (not illustrated). An electrostatic latent image which is formed on the photosensitive drum 160 (see FIG. 2) by the exposure is developed to be a toner image on the photosensitive drum 160, and then the toner image on the photosensitive drum 160 is transferred to the sheet of paper by the transfer process. The sheet having the toner image transferred thereon is conveyed to the fixation unit 103, where the toner image is fixed to the sheet by pressure and heat of about 160° C., and then is discharged to the outside.

Figure 6:
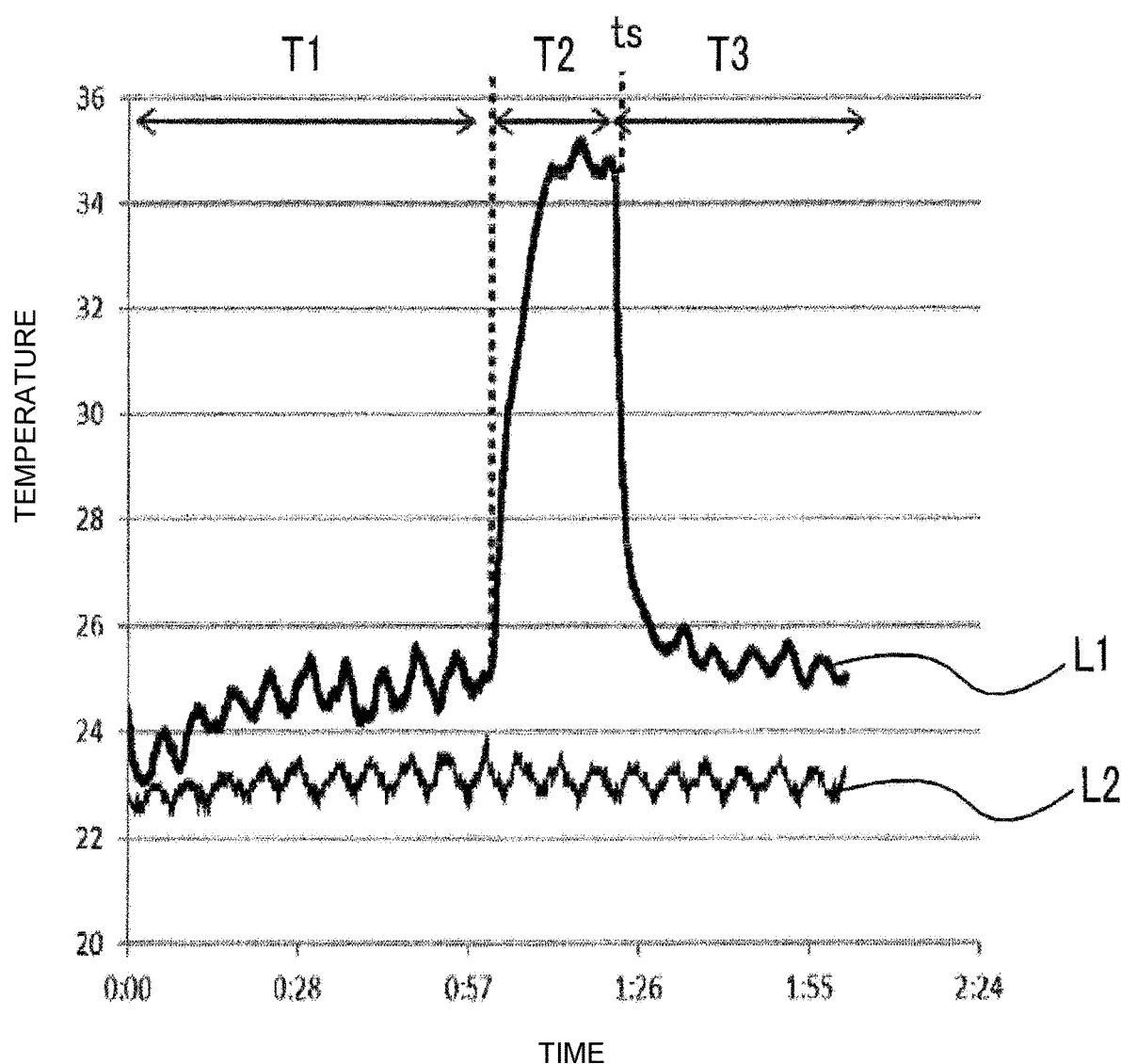
FIG. 6 is a graph illustrating an overshoot when an environmental sensor is placed adjacent to an air intake port for image dram (ID) cooling fans.

FIG. 6 is a graph for explaining overshoot of the temperature in a case where the environmental sensor 104 is positioned adjacent to the air intake port 111 of the ID cooling fans 108. The period T1 indicates a period of time when the printer 100 is turned on and printing is being performed, and the period T2 indicates a period of time when the printer 100 is turned off. At the time ts, it is assumed that the power of the printer 100 is turned on again, and printing is performed by the printer 100 in the period T3.

In FIG. 6, the line L1 indicates the environmental temperature calculated based on the voltage detected by the environmental sensor 104, and the line L2 indicates the outside temperature, which is the actual temperature in the environment in which the printer 100 is located.

During the printing in the period T1, the ID cooling fans 108 and the fixation fan 109 are rotating, so that the calculated environmental temperature is almost the same as or close to the actual outside temperature, although it deviates from the actual outside temperature by 1° C. to 1.5° C.

As illustrated in the period T2, when the ID cooling fans 108 and the fixation fan 109 are stopped after the printing is finished, the air around the air intake port 111 is heated by the heat from the fixation unit 103, so that the heat of the air around the air intake port 111 affects the environmental sensor 104, and the calculated environmental temperature may rise by about 10° C. with respect to the outside temperature.

At the time ts, the print controller 151 receives a print instruction from the host computer or the external device and starts to rotate the ID cooling fans 108 and the fixation fan 109. From the time ts, it takes about two minutes that the detected environmental temperature drops to 3° C. higher than the outside temperature. If the print controller was programed to start the printing after detecting the environmental temperature two minutes after receiving the print instruction, usability of the printer would be extremely poor. On the other hand, if the print controller was programed to start the printing immediately after receiving the print instruction even if the detected environmental temperature was off the outside temperature by 10° C., it would be meaningless to detect the environmental temperature.

Therefore, in an embodiment, the environmental value processor 152 stores the voltage value output from the environmental sensor 104 at an end of the previous printing in the environmental value storage 144. Then, when it is determined that the heat trapped in the printer 100 has already escaped after the previous printing (that is, when it is determined that the predetermined first threshold time (e.g., two hours) has elapsed since the voltage value of the environmental sensor 104 was stored), the print controller 151 uses the voltage value output by the environmental sensor 104 after the start of the current printing, for the printing device 140 to perform the current printing. To the contrary, when it is determined that the predetermined first threshold time (e.g., two hours) has not elapsed since the voltage value of the environmental sensor 104 was stored, the print controller 151 uses the voltage value stored in the environmental value storage 144, for the printing device 140 to perform the current printing. Accordingly, the printing can be performed with a small error of the environmental value.

As illustrated in FIG. 6, before the ID cooling fans 108 has been rotated for at least two minutes, the voltage value detected by the environmental sensor 104 indicating the environmental temperature would not be accurate to be stored in the environmental value storage 144. For this reason, the environmental value processor 152 does not store the environmental value acquired before the ID cooling fans 108 has been rotated for two minutes.

Figure 7:
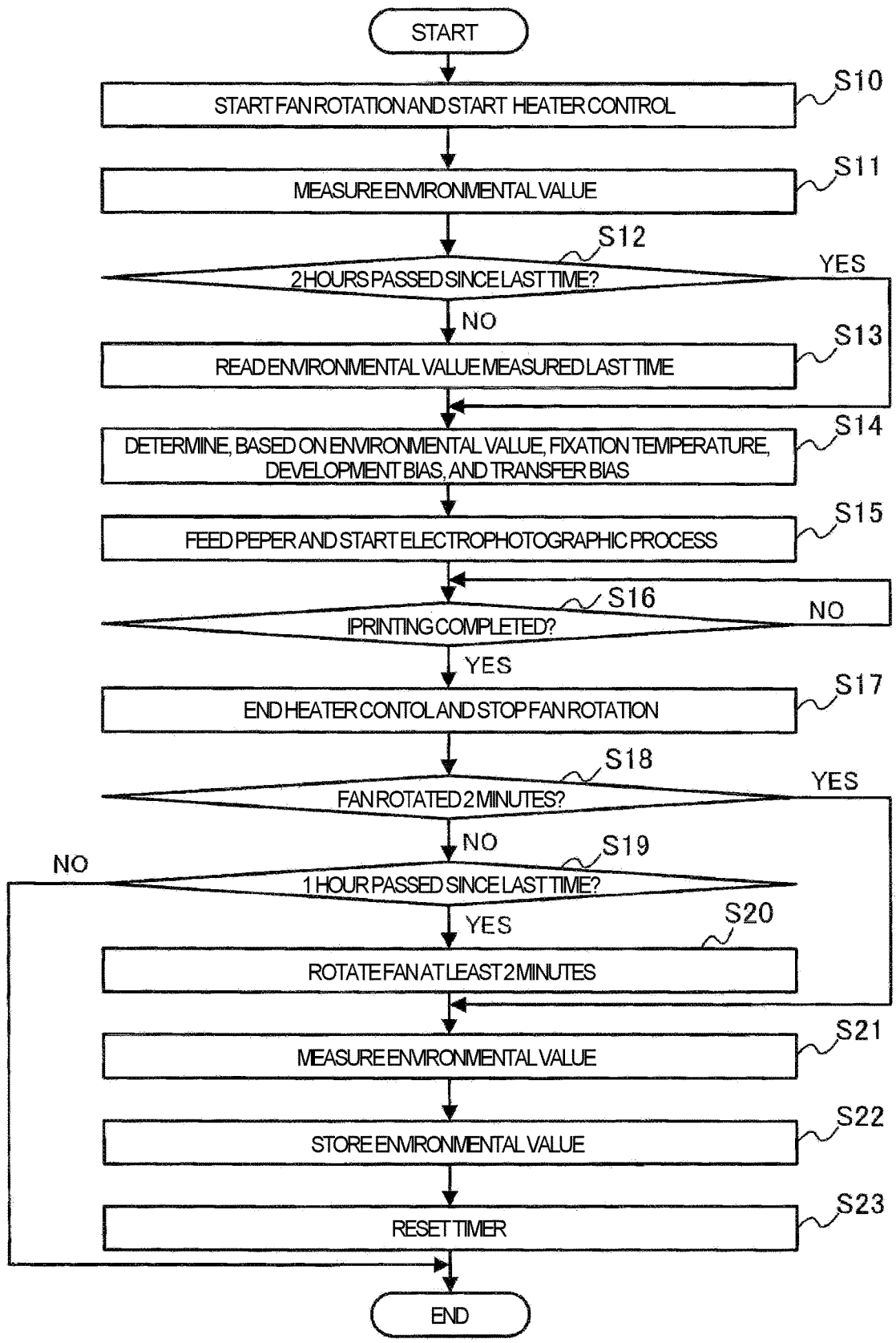
FIG. 7 is a flowchart illustrating a printing process in the printer according to a first embodiment.

FIG. 7 is a flowchart illustrating a printing operation (an image forming operation) in the printer 100 according to a first embodiment. In the flowchart illustrated in FIG. 7, the process is initiated when the print controller 151 receives a print job (image formation job) as a print instruction from the host computer or the external device.

When the print controller 151 finishes an expansion of print data (image formation data) included in the received print job, the print controller 151 starts the operation of the printing device 140. Then, the print controller 151 starts to rotate the ID cooling fans 108 and the fixation fan 109, tentatively determines the fixation temperature, and starts to heat the heater in the fixation unit 103 (step S10). For example, the print controller 151 tentatively determines a predetermined reference fixation temperature as the fixation temperature.

The print controller 151 can detect whether the ID cooling fans 108 is rotating or not rotating due to an error within 0.5 to 1 second from the start of rotation of the ID cooling fans 108. Thus, after confirming that the ID cooling fans 108 is rotating, the environmental value processor 152 reads the voltage value, which is the output of the environmental sensor 104, and stores the voltage value in the environmental value temporary storage 143 (step S11). Here, the environmental value processor 152 causes the voltage value corresponding to the environmental temperature and the voltage value corresponding to the environmental humidity which are detected by the environmental sensor 104 to be stored in the environmental value temporary storage 143.

The timing unit 153 determines whether or not the predetermined first threshold time has elapsed since the last time the voltage value, which is the output from the environmental sensor 104, was stored in the environmental value storage 144 (step S12). In an embodiment, the first threshold time is set to be two hours because, based on experimental results, it is assumed that the printer 100 has cooled down if two hours have elapsed since the previous printing was finished. If the predetermined first threshold time has elapsed (Yes in step S12), the process proceeds to step S14. If the predetermined first threshold time has not elapsed (No in step S12), the process proceeds to step S13.

In step S13, since the printer 100 has not yet cooled down, the environmental value processor 152 discards the voltage value corresponding to the environmental temperature among the voltage values stored in the environmental value temporary storage 143, reads the voltage value stored in the environmental value storage 144, and stores the read voltage value in the environmental value temporary storage 143. Then, the process proceeds to step S14.

In step S14, the print controller 151 calculates the environmental temperature and the environmental humidity using the voltage values stored in the environmental value temporary storage 143, and determines the fixation temperature, the development bias, and the transfer bias using the calculated environmental temperature and environmental humidity. Then, the print controller 151 replaces the fixation temperature tentatively determined in step S10 with the fixation temperature determined in step S14.

When the temperature of the heater in the fixation unit 103 exceeds a predetermined temperature, which is 10 degrees Celsius lower than the fixation temperature, the print controller 151 starts rotation of the ID motor 132, causes the paper feeding unit 101 to start paper feeding, and causes the image formation unit 102, the transfer roller 131, and the fixation unit 103 to start the process of forming an image on the medium by the electrophotographic process of exposure, development, transfer, and fixing (step S15).

Next, the print controller 151 determines whether or not the printing of all pages instructed in the print job has been completed (step S16). When all the pages have been printed (Yes in step S16), the process proceeds to step S17.

In step S17, the print controller 151 turns off heating of the heater in the fixation unit 103, stops the ID motor 132 and other motors, and also stops rotation of the ID cooling fans 108 and the fixation fan 109.

Then, the timing unit 153 determines whether or not the rotation time of the ID cooling fans 108 has passed a predetermined second threshold time since the rotation of the ID cooling fans 108 started in step S10 (step S18). Here, as described above, the second threshold time is set to two minutes because the temperature in the printer 100 is stabilized by rotating the ID cooling fans 108 for at least two minutes. If the rotation time has passed the second threshold time (Yes in step S18), the process proceeds to step S21. If the rotation time is less than the second threshold time (No in step S18), the process proceeds to step S19. The case has been described in which the rotation time of the ID cooling fans 108 is used for the determination, but the rotation time of the fixation fan 109 may be used for the determination.

In step S19, the timing unit 153 determines whether or not the predetermined third threshold time has elapsed since the last time the voltage value, which is the output from the environmental sensor 104, was stored in the environmental value storage 144. In an embodiment, the third threshold time is set to be one hour, based on experimental results, because one hour from the end of the previous printing may not sufficiently or completely cool the inside of the printer 100 but can cool the inside of the printer 100 to some extent. In other words, if a natural heat dissipation time of more than one hour still remains after a short time of printing is performed, in the two hours, which is used in step S12 for determining whether or not the elapsed time (the natural heat dissipation time) after the previous printing is sufficient, the inside of the printer 100 can be sufficiently cooled. On the other hand, in the two hours, if the natural heat dissipation time of more than one hour has not elapsed since the previous printing, the inside of the printer 100 can not sufficiently cooled by the natural heat dissipation. Therefore, if the third threshold time has not elapsed (No in step S19), the process ends, and if the third threshold time has elapsed (Yes in step S19), the process proceeds to step S20.

In step S20, the print controller 151 rotates the ID cooling fans 108 and the fixation fan 109, to make the rotation time since the rotation was started in step S10 become two minutes or more. Then, the process proceeds to step S21. In an embodiment described above, the case has been described in which the ID cooling fans 108 and the fixation fan 109 are rotated, but the disclosure is not limited thereto. For example, only any one of these may be rotated in the disclosure.

In step S21, the environmental value processor 152 reads the voltage value, which is the output of the environmental sensor 104, and stores it in the environmental value temporary storage 143. Then, the process proceeds to step S22.

In step S22, the environmental value processor 152 causes the environmental value storage 144 to store the voltage value corresponding to the environmental temperature among the voltage values stored in the environmental value temporary storage 143. Then, the timing unit 153 resets the value of the elapsed time from the time when the environmental value was saved the last time, and starts counting an elapsed time from the time when the environmental value was saved in step S22 again (step S23). In other words, the timing unit 153 counts again the elapsed time from zero.

As explained above, in the conventional technology, large errors in the detected environmental temperature and the detected environmental humidity may be caused by the heat generated inside the apparatus. However, in an embodiment, by storing the environmental value corresponding to the environmental temperature at the time of the previous printing and using the stored environmental value for the next printing, errors in the detected environmental temperature and the detected environmental humidity can be reduced. Therefore, each printing parameter based on the environmental temperature and environmental humidity can be set (corrected) to an appropriate value. That is, the temperature and humidity are appropriately corrected for printing with such reduction of the errors of the detected environmental temperature and humidity. Better image formation results can be obtained with reducing shifts in density and reducing degradation of fixing performance.

Second Embodiment

As illustrated in FIG. 1, a printer 200 according to a second embodiment includes the paper feeding unit 101, the image formation unit 102 as the printing unit, and the fixation unit 103, as in the printer 100 according to a first embodiment.

The positions of the fans in the printer 200 according to a second embodiment is also the same as those in the printer 100 according to a first embodiment, as illustrated in FIGS. 2 and 3. Note that the printer 200 according to a second embodiment is equipped with both the fixation fan 109 as an exhaust fan and the ID cooling fans 108 as intake fans. Further, the circuit of the control system in the printer 200 according to a second embodiment is also the same as the circuit of the control system in the printer 100 according to a first embodiment, as illustrated in FIG. 4. However, the printer 200 according to a second embodiment differs from the printer 100 according to a first embodiment in functions realized by the circuit of the control system illustrated in FIG. 4. The functions of the printer 200 according to a second embodiment are described below with reference to FIG. 5.

As illustrated in FIG. 5, the printer 200 according to a second embodiment includes the printing device 140 as the image formation section, the cooling device 141, the environmental value detector 142, the environmental value temporary storage 143, the environmental value storage 144, and a controller 250. The printing device 140, the cooling device 141, the environmental value detector 142, the environmental value temporary storage 143, and the environmental value storage 144 of the printer 200 according to a second embodiment are the same as the printing device 140, the cooling device 141, the environmental value detector 142, the environmental value temporary storage 143, and the environmental value storage 144 of the printer 100 according to a first embodiment. Note that the cooling device 141 according to a second embodiment has both the ID cooling fans 108 and the fixation fan 109 illustrated in FIG. 2 or FIG. 3.

The controller 250 controls the overall processing in the printer 200. The controller 250 includes a print controller 251 as an image formation controller, an environmental value processor 252, and the timing unit 153. The timing unit 153 of the controller 250 in a second embodiment is the same as the timing unit 153 of the controller 150 in a first embodiment.

Also in a second embodiment, the controller 250 is realized by the processor 121 executing a program stored in the FRASH ROM 122 that functions as a memory. Such a program may be provided through a network or provided by being recorded in a recording medium. That is, such a program may be provided, for example, as a program product.

A part or all of the controller 250 may be composed of, for example, a single circuit, a composite circuit, a processor operating with a program, a parallel processor operating with a program, or a processing circuit such as an ASIC and an FPGA. As described above, the controller 250 can be realized by a processing circuit network.

The print controller 251 controls the printing device 140 to form an image on a medium in the same manner as in a first embodiment. For example, when the printing device 140 starts a printing operation, the print controller 251 selects one of the environmental value detected by the environmental value detector 142 after the cooling device 141 starts cooling and the environmental value stored in the environmental value storage 144. Then, the print controller 251 calculates, based on the selected environmental value, a parameter for the current printing operation in the printing device 140, and causes the printing device 140 to perform the current printing operation based on the calculated parameter.

Specifically, the print controller 151 selects the environmental value detected by the environmental value detector 142 after the cooling device 141 starts cooling, when the predetermined first threshold time has elapsed since the environmental value was saved in the environmental value storage 144, and selects the environmental value saved in the environmental value storage 144 when the first threshold time has not elapsed since the environmental value was saved in the environmental value storage 144.

After the printing by the printing device 141 is finished, the print controller 251 stops the rotation of the fixation fan 109, but continues the rotation of the ID cooling fans 108. Then, the print controller 251 causes, after a predetermined fourth threshold time has elapsed after the rotation of the fixation fan 109 was stopped, the environmental value detector 142 to measure the environmental value, and then stops the rotation of the ID cooling fans 108.

The environmental value processor 252 processes the environmental value detected by the environmental value detector 142. For example, the environmental value processor 252 temporarily stores the environmental value detected by the environmental value detector 142 in the environmental value temporary storage 143. Further, when the predetermined condition(s) is satisfied, the environmental value processor 252 causes a necessary environmental value to be stored in the environmental value storage 144 among the environmental values temporarily stored in the environmental value temporary storage 143.

Specifically, when an operating time of the ID cooling fans 108, which is a time in which the ID cooling fans 108 has rotated since the fixation fan 109 was stopped after the printing device 140 finished the printing, has passed the predetermined fourth threshold time, the environmental value processor 252 causes the environmental value that is detected by the environmental value detector 142 after the predetermined fourth threshold time has elapsed, to be stored in the environmental value storage 144 as a new environmental value.

FIG. 8 is a table illustrating changes in the temperature detected by the environmental value detector 142 in the printer 200 installed at a distance of only 10 cm from a wall, in a case where, after printing is finished, the rotation of the ID cooling fans 108 is continued but the rotation of the fixation fan 109 is stopped, and in a case where, after printing is finished, the rotation of the ID cooling fans 108 and the rotation of the fixation fan 109 are continued.

As illustrated in FIG. 8, the temperature is 24° C. immediately after turning on the power of the printer, and rises to 33° C. after printing 250 sheets. Note that in the example illustrated in FIG. 6, the temperature rises to about 35° C. immediately after the printing is finished, but in a second embodiment, the temperature is lower than that in a first embodiment because the ID cooling fans 108 are still rotating after the printing is finished.

Thereafter, in the case where the rotation of the fixation fan 109 is continued after the printing is finished, the temperature decreases by only 2° C. to 31° C. one minute after the printing is finished. On the other hand, in the case where the rotation of the fixation fan 109 is stopped after the printing is finished, the temperature drops by 6° C. to 27° C. one minute after the printing is finished, and thus the environmental temperature with a smaller error can be detected. Note that in a second embodiment, since the printer 200 is only 10 cm away from the wall, the heat tends to be trapped, and it may be thought that the temperature is more difficult to be lowered than in a first embodiment.

As described above, after the printing is finished, it may be preferable that the rotation of the fixation fan 109 is stopped but the rotation of the ID cooling fans 108 is continued for at least one minute, to obtain an accurate temperature. Thus, it may be preferable that the fourth threshold time be set to one minute. Therefore, after the printing is finished, the rotation of the fixation fan 109 is stopped while the rotation of the ID cooling fans 108 is continued for one minute, and after the one minute has elapsed, the environmental value processor 252 causes the temperature detected by the environmental value detector 142 to be stored in the environmental value storage 144.

Figure 9:
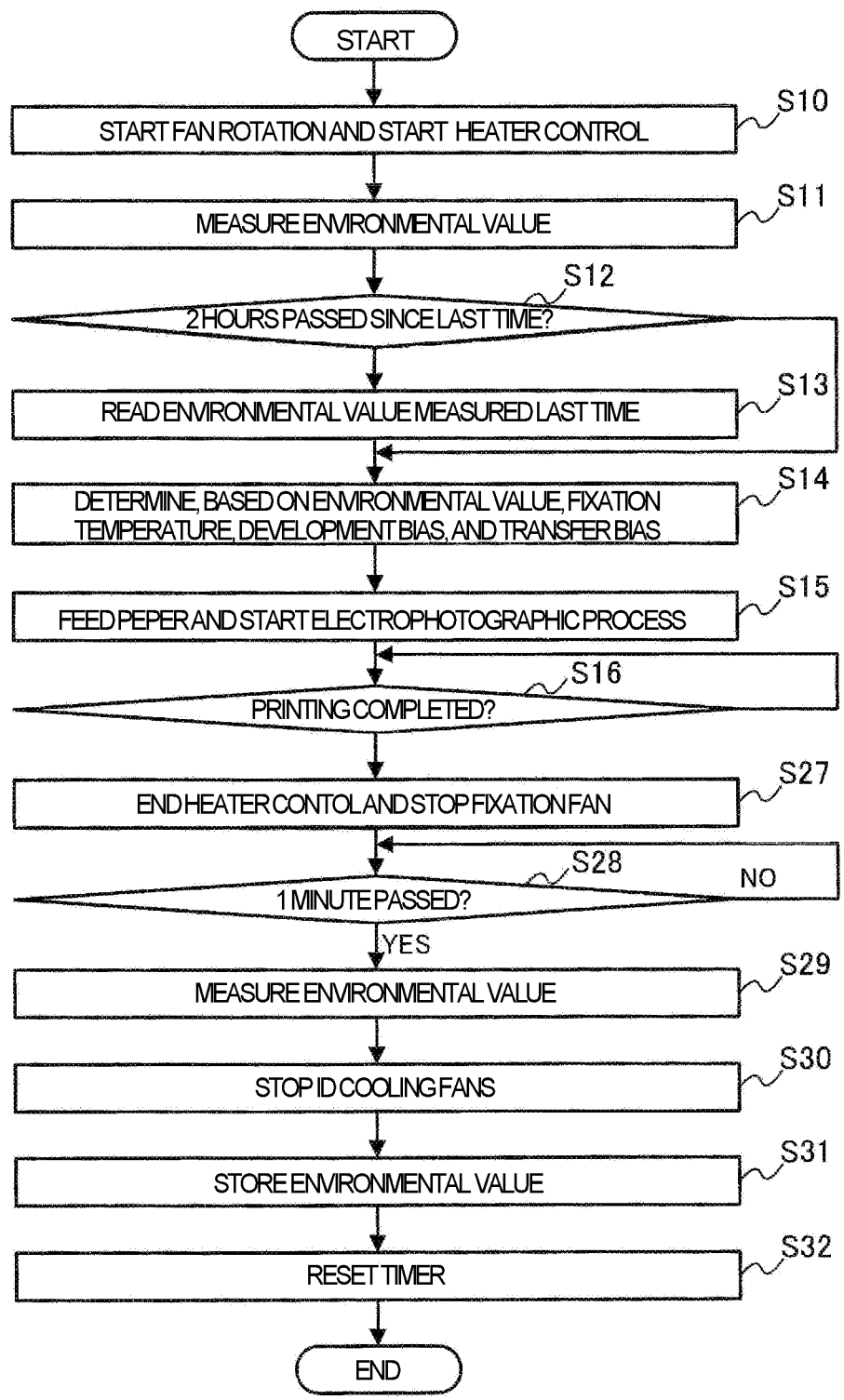
FIG. 9 is a flowchart illustrating a printing operation of the printer according to a second embodiment.

FIG. 9 is a flowchart illustrating a printing operation (image forming operation) in the printer 200 according to a second embodiment. In FIG. 9, steps that are processed in the same way as in the flowchart illustrated in FIG. 7 are indicated with the same reference numerals as in FIG. 7. In the flowchart illustrated in FIG. 9, the process is also started when the print controller 251 receives a print job (image formation job) as a print instruction from the host computer or the external apparatus.

The processing from step S10 to step S16 of the flowchart illustrated in FIG. 9 is the same as the processing from step S10 to step S16 of the flowchart illustrated in FIG. 7. However, in the flowchart illustrated in FIG. 9, after step S16, the process proceeds to step S27.

In step S27, the print controller 251 turns off heating of the heater in the fixation unit 103, stops the ID motor 132 and other motors, and also stops rotation of the fixation fan 109. At this timing, the print controller 251 according to a second embodiment does not stop the rotation of the ID cooling fans 108, but continues the rotation of the ID cooling fans 108.

Then, in step S28, the timing unit 153 determines whether the rotation time of the ID cooling fans 108 has passed the fourth threshold time since the rotation of the fixation fan 109 was stopped in step S27. Here, as described above, the fourth threshold time is set to be one minute because the temperature in the printer 200 is stabilized by rotating the ID cooling fans 108 for at least one minute. If the rotation time has passed the fourth threshold time (Yes in step S28), the process proceeds to step S29.

In step S29, the environmental value processor 252 reads the voltage value, which is the output of the environmental sensor 104, and stores the read voltage value in the environmental value temporary storage 143. Then, in step S30, the print controller 251 stops the rotation of the ID cooling fans 108.

Next, in step S31, the environmental value processor 252 causes the environmental value storage 144 to store a voltage value corresponding to the environmental temperature among the voltage values stored in the environmental value temporary storage 143. Then, in step S32, the timing unit 153 resets the elapsed time, which is the time length counted from the time when the environmental value was saved the last time, and starts again counting an elapsed time from the time when the environmental value was saved in step S30. In other words, the timing unit 153 counts again the elapsed time from zero.

As described above, according to a second embodiment, even when the printer 200 is placed in the environment in which heat is easily trapped, such as being placed near the wall, errors of the environmental temperature and the environmental humidity can be reduced. As a result, the detected values of the temperature and humidity are corrected for printing, and better image formation results can be obtained without shifts in the density in the printed image and degradation of the fixing performance.

Third Embodiment

As illustrated in FIG. 1, a printer 300 according to a third embodiment is provided with the paper feeding unit 101, the image formation unit 102 as the printing unit, and the fixation unit 103, as in the printer 100 according to a first embodiment.

The positions of the fans in the printer 300 according to a third embodiment are also the same as those in the printer 100 according to a first embodiment, as illustrated in FIGS. 2 and 3. Note that the printer 300 according to a third embodiment is equipped with both the fixation fan 109 as an exhaust fan and the ID cooling fans 108 as intake fans. Further, as illustrated in FIG. 4, the circuit of the control system provided in the printer 300 according to a third embodiment is also same as the circuit of the control system provided in the printer 100 according to a first embodiment. However, the printer 300 according to a third embodiment differs from the printer 100 according to a first embodiment in the functions realized by the circuit of the control system illustrated in FIG. 4. The functions of the printer 300 according to a third embodiment are described below with reference to FIG. 5.

As illustrated in FIG. 5, the printer 300 according to a third embodiment includes the printing device 140 as the image formation device, the cooling device 141, the environmental value detector 142, the environmental value temporary storage 143, the environmental value storage 144, and a controller 350. The printing device 140, the cooling device 141, the environmental value detector 142, the environmental value temporary storage 143, and the environmental value storage 144 of the printer 300 according to a third embodiment are the same as the printing device 140, the cooling device 141, the environmental value detector 142, the environmental value temporary storage 143, and the environmental value storage 144 of the printer 100 according to a first embodiment. However, the cooling device 141 in a third embodiment includes both the ID cooling fans 108 and the fixation fan 109 illustrated in FIG. 2 or FIG. 3.

The controller 350 controls the overall processing in the printer 300. The controller 350 includes a print controller 351 as an image formation controller, the environmental value processor 252, and the timing unit 153. The timing unit 153 of the controller 350 in a third embodiment is the same as the timing unit 153 of the controller 150 in a first embodiment.

Also in a third embodiment, the controller 350 is realized by the processor 121 executing a program stored in the FRASH ROM 122 that functions as a memory. Such a program may be provided through a network or provided by being recorded in a recording medium. That is, such a program may be provided, for example, as a program product.

A part or all of the controller 350 may be composed of, for example, a single circuit, a composite circuit, a processor operating with a program, a parallel processor operating with a program, or a processing circuit such as an ASIC and an FPGA. As described above, the controller 350 can be realized by a processing circuit network.

The print controller 351 controls the printing device 140 to form an image on a medium in the same manner as in a first embodiment. For example, when the printing device 140 starts a current printing operation, the print controller 351 selects one of the environmental value detected by the environmental value detector 142 after the cooling device 141 starts cooling and the environmental value stored in the environmental value storage 144. Then, the print controller 351 calculates, based on the selected environmental value, a parameter for the printing device 140 to perform the current printing operation, and causes the printing device 140 to print based on the calculated parameter.

Specifically, when the predetermined first threshold time has elapsed since the environmental value was stored in the environmental value storage 144, the print controller 351 selects the environmental value detected by the environmental value detector 142 after the cooling device 141 starts cooling. On the other hand, when the first threshold time has not elapsed since the environmental value was stored in the environmental value storage 144, the printer controller 31selects the environmental value stored in the environmental value storage 144.

When the printing is completed, if the operating time of the cooling device 141, which is the time in which the cooling device 141 has operated since the printing started, has passed the second threshold time, the print controller 351 causes the environmental value detector 142 to measure the environmental value and then stops the operation of the cooling device 141 (that is, stops the rotation of the fixation fan 109 and the rotation of the ID cooling fans 108). On the other hand, when the printing is completed, if the operating time of the cooling device 141, which is the time in which the cooling device 141 has operated after the printing was started, has not passed the second threshold time, the print controller 351 stops the rotation of the fixation fan 109 but continues the rotation of the ID cooling fans 108. Then, the print controller 351 causes the environmental value detector 142 to measure the environmental value after the predetermined fourth threshold time has elapsed since the rotation of the fixation fan 109 was stopped, and then stops the rotation of the ID cooling fans 108.

The environmental value processor 352 processes the environmental value detected by the environmental value detector 142. For example, the environmental value processor 352 temporarily stores the environmental value detected by the environmental value detector 142 in the environmental value temporary storage 143. Further, when a predetermined condition(s) is satisfied, the environmental value processor 352 causes a necessary environmental value to be stored in the environmental value storage 144 among the environmental values temporarily stored in the environmental value temporary storage 143.

Specifically, when it is determined that the operating time of the cooling device 141, which is the time in which the cooling device 141 has operated after the printing device 140 started the current printing, has passed the predetermined second threshold time, the environmental value processor 352 stores the environmental value that is detected by the environmental value detector 142 after the operating time of the cooling device 141 has passed the predetermined second threshold time in the environmental value storage 144 as a new environmental value. Note that when it is determined that the predetermined third threshold time has elapsed but the predetermined first threshold time has not elapsed since the environmental value was stored in the environmental value storage 144, the print controller 351 operates the cooling device 141 until the operating time of the ID cooling fan 108 passes the fourth threshold time, even if the current printing operation finishes before the second threshold time elapses. This allows the environmental value stored in the environmental value storage 144 to be updated with the environmental value detected after the printing device 140 has been sufficiently cooled. Note that the third threshold time is shorter than the first threshold time. Specifically, when it is determined that the operating time of the cooling device 141, which is the time in which the cooling device 141 has operated after the printing device 140 started the current printing operation, has not passed the predetermined second threshold time, the environmental value processor 352 stores the environmental value that is detected by the environmental value detector 142 after the operating time of the ID cooling fans 108 has passed the predetermined fourth threshold time since the rotation of the fixation fan 109 was stopped after the printing device 140 finished the current printing, in the environmental value storage 144 as a new environmental value.

Figure 10:
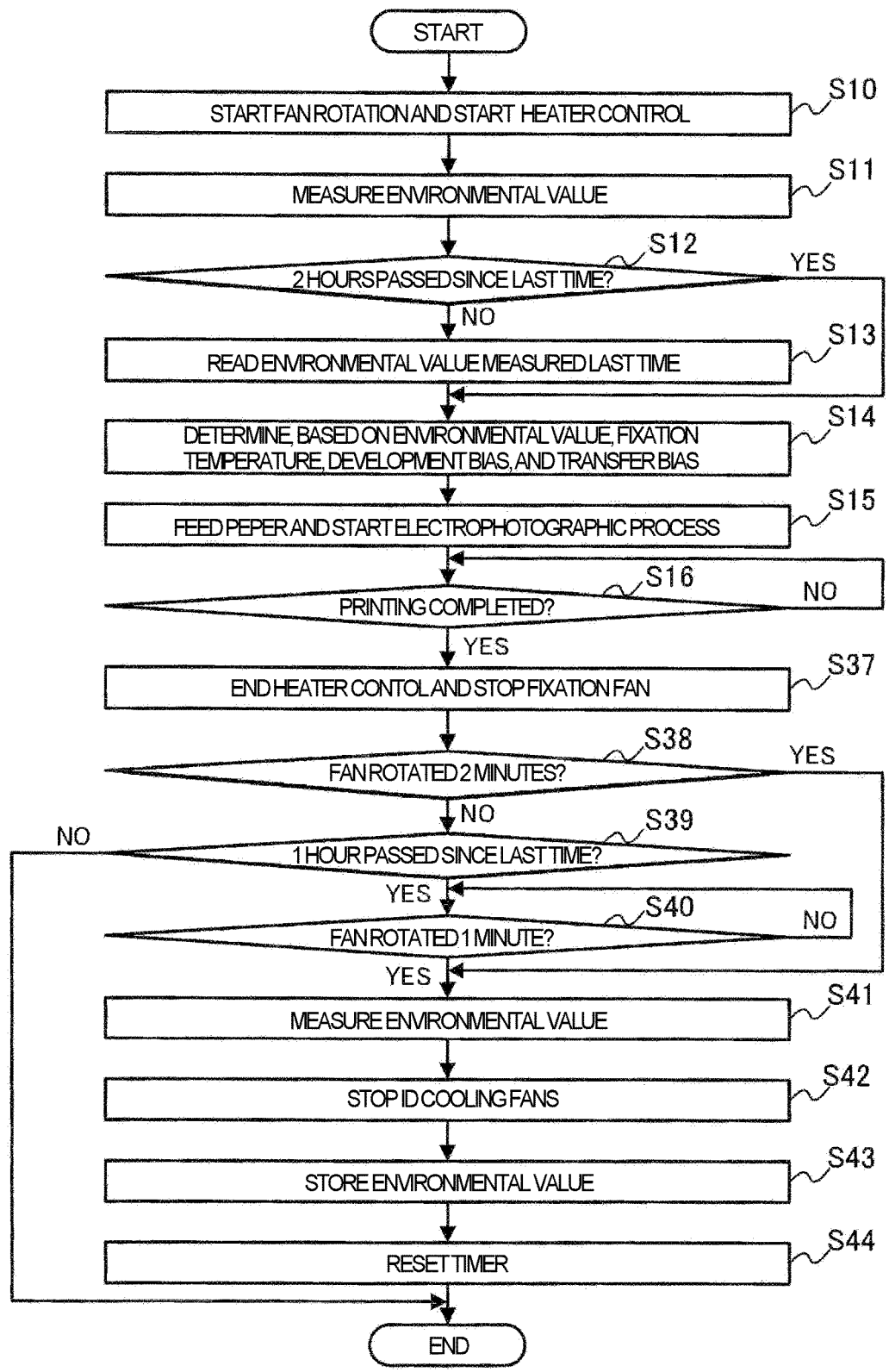
FIG. 10 is a flowchart illustrating a printing operation of the printer according to a third embodiment.

FIG. 10 is a flowchart illustrating a printing operation (image forming operation) in the printer 300 according to a third embodiment. In FIG. 10, the same reference numerals as in FIG. 7 are used for the steps that are processed in the same way as in the flowchart illustrated in FIG. 7. In the flowchart illustrated in FIG. 10, the process is also started when the print controller 351 receives a print job (image formation job) as a print instruction from the host computer or the external apparatus.

The processing from step S10 to step S16 in the flowchart illustrated in FIG. 10 is the same as the processing from step S10 to step S16 in the flowchart illustrated in FIG. 7. However, in the flowchart illustrated in FIG. 10, after step S16, the process proceeds to step S37.

In step S37, the print controller 351 turns off heating of the heater in the fixation unit 103, stops the ID motor 132 and other motors, and also stops the rotation of the fixation fan 109. At this timing, the print controller 351 according to a third embodiment does not stop the rotation of the ID cooling fans 108, that is, continues the rotation of the ID cooling fans 108.

Then, in step S38, the timing unit 153 determines whether or not the rotation time of the ID cooling fans 108 has passed the predetermined second threshold time since the rotation of the ID cooling fans 108 has started in step S10. Here, the second threshold time is set to 2 minutes. If the rotation time of the ID cooling fans 108 has passed the predetermined second threshold time (Yes in step S38), the process proceeds to step S41. On the other hand, if the rotation time of the ID cooling fans 108 is less than the predetermined second threshold time (No in step S38), the process proceeds to step S39. The case has been described in which the rotation time of the ID cooling fans 108 is used for the determination, but the rotation time of the fixation fan 109 may be used for the determination.

In step S39, the timing unit 153 determines whether or not the predetermined third threshold time has elapsed since the last time the voltage value, which is the output of the environmental sensor 104, was stored in the environmental value storage 144. In a third embodiment, the third threshold time is set to one hour. If the third threshold time has not elapsed (No in step S39), the process ends, and if the third threshold time has elapsed (Yes in step S39), the process proceeds to step S40.

In step S40, the timing unit 153 determines whether or not the rotation time of the ID cooling fans 108 has passed the predetermined fourth threshold time since the rotation of the fixation fan 109 was stopped in step S37. In a third embodiment, the fourth threshold time is set to one minute. If the rotation time of the ID cooling fans 108 has passed the predetermined fourth threshold time (Yes in step S40), the process proceeds to step S41.

In step S41, the environmental value processor 352 reads the voltage value, which is the output of the environmental sensor 104, and stores it in the environmental value temporary storage 143. Then, in step S42, the print controller 351 stops the rotation of the ID cooling fans 108.

Next, in step S43, the environmental value processor 352 causes the environmental value storage 144 to store a voltage value corresponding to the environmental temperature among the voltage values stored in the environmental value temporary storage 143. Then, in step S44, the timing unit 153 resets the value of the elapsed time from the time when the environmental value was saved the last time, and starts counting again an elapsed time from the time when the environmental value was saved in step S43. In other words, the timing unit 153 counts again the elapsed time from zero.

As described above, according to a third embodiment, errors of the environmental temperature and the environmental humidity can be reduced even when the printer 300 is placed in an environment where the heat is easily trapped, such as being placed near the wall. As a result, the detected values of the temperature and humidity are corrected for printing, and better image formation results can be obtained without shifts in the density in the printed image and degradation of the fixing performance.

In first to third embodiments described above, the case has been described in which the environmental value processor 152, 252, or 352 cause the environmental value storage 144 to store the voltage value corresponding to the environmental temperature or the voltage values corresponding to the environmental temperature and humidity. However, the disclosure is not limited thereto. For example, the environmental value processor 152, 252, 352 may cause an environmental temperature calculated by the print controller 151, 251, 351 or environmental temperature and humidity calculated by the print controller 151, 251, 351 to be stored in the environmental value storage 144.

In first to third embodiments described above, the case has been described in which the electrophotographic printer 100, 200, or 300 is used as an example. However, the disclosure is not limited thereto. For example, in a disclosure, an inkjet printer may be used as a printer. In a system that emits hot air to dry ink, such as an inkjet printer, it may be difficult to accurately detect the environmental temperature and humidity due to the rise in the internal temperature in the printer. Therefore, errors of the environmental temperature and environmental humidity can be reduced in such an inkjet printer by performing a control same as or similar to the control in first to third embodiments described above. This can improve the accuracy of the control of at least any one of the discharge amount of the ink and the degree of drying the ink.

The invention includes other embodiments or modifications in addition to one or more embodiments and modifications described above without departing from the spirit of the invention. The one or more embodiments and modifications described above are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A printing apparatus comprising:
   a printing device configured to print on a medium;
   a cooling device configured to cool the printing device;
   an environmental value detector configured to detect an environmental value, which is a value corresponding to a physical quantity of an environment in the printing apparatus;
   an environmental value storage storing the environmental value detected by the environmental value detector before a start of a current printing operation; and
   a print controller configured, in response to starting the current printing operation, to select one of: the environmental value stored in the environmental value storage before the start of the current printing operation; and an environmental value detected by the environmental value detector after a start of cooling of the printing device by the cooling device in the current printing operation, calculate, based on the selected environmental value, a parameter for the printing device to perform the current printing operation, and cause the printing device to perform the current printing operation based on the calculated parameter.

2. The printing apparatus according to claim 1, wherein the print controller is configured, when a first threshold time has elapsed since the environmental value was stored in the environmental value storage, to select the environmental value detected by the environmental value detector after the start of cooling of the printing device by the cooling device, and is configured, when the first threshold time has not elapsed since the environmental value was stored in the environmental value storage, to select the environmental value stored in the environmental value storage before the start of the current printing operation.

3. The printing apparatus according to claim 2, further comprising:
   an environmental value processor configured, when an operating time of the cooling device, which is a time in which the cooling device has operated after the printing device started the current printing operation, has passed a second threshold time, to store the environmental value that is detected by the environmental value detector after the operating time of the cooling device has passed the second threshold time in the environmental value storage as a new environmental value, wherein
   the print controller is configured, in response to receiving an instruction to perform a next printing operation after the new environmental value was stored, to determine whether or not the first threshold time has passed since the new environmental value was stored.

4. The printing apparatus according to claim 3, wherein
the print controller is configured, in response to determining that a predetermined third threshold time has elapsed but the first threshold time has not elapsed since the environmental value was stored in the environmental value storage, to operate the cooling device until the operating time of the cooling device passes the second threshold time, even when the printing device completes the current printing operation before the operating time of the cooling device passes the second threshold time.

5. The printing apparatus according to claim 3, wherein
the cooling device comprises an exhaust fan configured to rotate to discharge air from the printing apparatus and an intake fan configured to rotate to intake air into the printing apparatus,
the print controller is configured, in response to determining that the printing device completes the current printing operation before the operating time of the cooling device including the exhaust fan and the intake fan passes the second threshold time and determining that a predetermined third threshold time has elapsed but the first threshold time has not elapsed since the environmental value was stored in the environmental value storage, to stop a rotation of the exhaust fan and continue a rotation of the intake fan until an operating time of the intake fan, which is a time in which the intake fan has rotated since the rotation of the exhaust fan was stopped, passes a fourth threshold time, and
the environmental value processor is configured to store the environmental value that is detected by the environmental value detector after the operating time of the intake fan, which is the time in which the intake fan has rotated since the rotation of the exhaust fan was stopped, has passed the fourth threshold time, in the environmental value storage as a new environmental value.

6. The printing apparatus according to claim 5, wherein
the environmental value detector is disposed at a passage through which the intake fan takes air into the printing apparatus from an air intake port of the printing apparatus.

7. The printing apparatus according to claim 2, wherein
the cooling device comprises an exhaust fan configured to rotate to discharge air from the printing apparatus and an intake fan configured to rotate to intake air into the printing apparatus,
the print controller is configured, when the printing device completes the current printing operation, to stop a rotation of the exhaust fan but continues a rotation of the intake fan,
the printing apparatus further comprises an environmental value processor configured to store the environmental value that is detected by the environmental value detector after an operating time of the intake fan, which is a time in which the intake fan has rotated since the rotation of the exhaust fan was stopped, has passed a fourth threshold time, in the environmental value storage as a new environmental value, and
the print controller is configured, in response to receiving an instruction to perform a next printing operation after the new environmental value was stored, to determine whether or not the first threshold time has elapsed since the new environmental value was stored.

8. The printing apparatus according to claim 7, wherein
the environmental value detector is disposed at a passage through which the intake fan takes air into the printing apparatus from an air intake port of the printing apparatus.

9. The printing apparatus according to claim 1, wherein
the environmental value comprises a voltage value corresponding to an environmental temperature, which is a temperature of an environment around the printing device.

10. The printing apparatus according to claim 1, wherein
the environmental value comprises a voltage value corresponding to an environmental temperature, which is a temperature of an environment around the printing device and a voltage value corresponding to an environmental humidity, which is a humidity of the environment around the printing device.

11. The printing apparatus according to claim 1, wherein
the parameter is at least one of a fixation temperature, a development bias, and a transfer bias.

12. The printing apparatus according to claim 1, wherein
the parameter is at least one of a voltage to discharge an ink and a drying time of the ink, the ink being used in the printing device to print on the medium.

13. The printing apparatus according to claim 1, wherein
the cooling device comprises an intake fan configured to rotate to intake air into the printing apparatus,
the environmental value detector is provided in a passage through which the intake fan takes air into the printing apparatus from an air intake port of the printing apparatus and configured to detect the environmental value, which is the value corresponding to the physical quantity of the environment in the printing apparatus.

14. The printing apparatus according to claim 13, wherein
the intake fan is provided between the air intake port and an image formation unit of the printing device,
an air duct defining at least a part of the passage is provided between the air intake port and the intake fan, and
the environmental value detector is provided between the air intake port and the intake fan in the air duct.

15. The printing apparatus according to claim 14, wherein
the air duct is located between the image formation unit and a fixation unit of the printing device,
the air duct includes a first wall portion provided on a side of the image formation unit and a second wall portion provided on a side of the fixation unit, and
the environmental value detector is provided at a position closer to the first wall portion than the second wall portion in the air duct.

* * * * *